US012780663B2

(12) United States Patent
Fujimori et al.

(10) Patent No.: US 12,780,663 B2
(45) Date of Patent: Nov. 3, 2026

(54) METHOD AND APPARATUS FOR MANUFACTURING CARBON NANOTUBE ASSEMBLED WIRE

(71) Applicants: SUMITOMO ELECTRIC INDUSTRIES, LTD., Osaka (JP); UNIVERSITY OF TSUKUBA, Tsukuba (JP)

(72) Inventors: Toshihiko Fujimori, Osaka (JP); Daiji Yamashita, Osaka (JP); Takamasa Onoki, Osaka (JP); Soichiro Okubo, Osaka (JP); Takeshi Hikata, Osaka (JP); Junichi Fujita, Tsukuba (JP)

(73) Assignees: SUMITOMO ELECTRIC INDUSTRIES, LTD., Osaka (JP); UNIVERSITY OF TSUKUBA, Tsukuba (JP)

( * ) Notice: Subject to any disclaimer, the term of this patent is extended or adjusted under 35 U.S.C. 154(b) by 337 days.

(21) Appl. No.: 18/686,143

(22) PCT Filed: Aug. 18, 2022

(86) PCT No.: PCT/JP2022/031196
§ 371 (c)(1),
(2) Date: Feb. 23, 2024

(87) PCT Pub. No.: WO2023/026950
PCT Pub. Date: Mar. 2, 2023

(65) Prior Publication Data

US 2024/0367978 A1 Nov. 7, 2024

(30) Foreign Application Priority Data

Aug. 25, 2021 (JP) ................................ 2021-137322

(51) Int. Cl.
*C01B 32/16* (2017.01)
*C01B 32/168* (2017.01)
(Continued)

(52) U.S. Cl.
CPC ............ *C01B 32/16* (2017.08); *C01B 32/168* (2017.08); *C30B 25/005* (2013.01); *D01F 9/1272* (2013.01); *D01F 9/133* (2013.01)

(58) Field of Classification Search
CPC ..... C01B 32/16; C01B 13/168; C30B 25/005; D01F 9/1272
See application file for complete search history.

(56) References Cited

U.S. PATENT DOCUMENTS 6,878,360 B1 4/2005 Ohsaki et al.
9,896,338 B1 * 2/2018 Chester .................. C30B 25/12
(Continued)

FOREIGN PATENT DOCUMENTS

CN 1376218 A 10/2002
JP 2001-073231 A 3/2001
(Continued)

*Primary Examiner* — Robert M Kunemund
(74) *Attorney, Agent, or Firm* — Oliff PLC

(57) ABSTRACT

A method for manufacturing a carbon nanotube assembled wire includes: a first step of supplying a carbon-containing gas at one, first end of a tubular carbon nanotube synthesis furnace to grow a carbon nanotube from each of a plurality of catalyst particles suspended in the carbon nanotube synthesis furnace to synthesize a plurality of carbon nanotubes; a second step of orienting the plurality of carbon nanotubes in a longitudinal direction of the carbon nanotubes in a first channel provided in the carbon nanotube synthesis furnace, and thus assembling them together, to form a carbon nanotube assembled wire; and a third step of collecting the carbon nanotube assembled wire using a collecting gas stream flowing from a second end of the
(Continued)

carbon nanotube synthesis furnace opposite to the first end in a direction away from the carbon nanotube synthesis furnace.

9 Claims, 3 Drawing Sheets

(51) Int. Cl.

| | |
|---|---|
| ***C30B 25/00*** | (2006.01) |
| ***D01F 9/127*** | (2006.01) |
| ***D01F 9/133*** | (2006.01) |

(56) References Cited

U.S. PATENT DOCUMENTS

| | | | | |
|---|---|---|---|---|
| 2013/0170592 | A1* | 7/2013 | Zhou | H01J 27/02 376/114 |
| 2014/0166969 | A1* | 6/2014 | Tendulkar | H10N 70/826 257/4 |
| 2019/0374918 | A1 | 12/2019 | Jeong et al. | |
| 2022/0064003 | A1 | 3/2022 | Fujimori et al. | |
| 2022/0153585 | A1 | 5/2022 | Hikata et al. | |

FOREIGN PATENT DOCUMENTS

| | | | | |
|---|---|---|---|---|
| JP | 2004-270072 | A | 9/2004 | |
| JP | 2012-046841 | A | 3/2012 | |
| JP | 2020-507555 | A | 3/2020 | |
| WO | WO-2016009207 | A1 * | 1/2016 | C01B 32/162 |
| WO | 2020/138378 | A1 | 7/2020 | |
| WO | 2020/171047 | A1 | 8/2020 | |

* cited by examiner

METHOD AND APPARATUS FOR MANUFACTURING CARBON NANOTUBE ASSEMBLED WIRE

TECHNICAL FIELD

The present disclosure relates to a method and apparatus for manufacturing a carbon nanotube assembled wire. The present application claims priority based on Japanese Patent Application No. 2021-137322 filed on Aug. 25, 2021. The entire contents of the description in this Japanese patent application are incorporated herein by reference.

BACKGROUND ART

A carbon nanotube (hereinafter also referred to as "CNT") composed of a cylindrical graphene sheet made of carbon atoms bonded in a hexagonal pattern is a material having a mass that is one fifth of that of copper, a strength that is 20 times that of steel, and excellent conductivity. Thus, an electric wire using the carbon nanotube is expected as a material contributing to decreased weight and size and improved corrosion resistance of motors for automobiles in particular.

Currently manufactured carbon nanotubes have a diameter of about 0.4 nm to 20 nm and a maximum length of about 55 cm. In order to use a carbon nanotube as an electric wire, a high strength material and the like, the carbon nanotube needs to be longer wire, and accordingly, techniques using carbon nanotubes to obtain elongated wire have been studied.

For example, International Publication No. 2020/138378 (PTL 1) discloses a method for obtaining an elongated carbon nanotube assembled wire by supplying a carbon-containing gas to catalyst particles suspended in a carbon nanotube synthesis furnace to grow a plurality of carbon nanotubes from the catalyst particles, and orientating the plurality of carbon nanotubes in their longitudinal direction and thus assembling them together.

CITATION LIST

Patent Literature

PTL 1: WO 2020/138378

SUMMARY OF INVENTION

A method for manufacturing a carbon nanotube assembled wire according to the present disclosure comprises:

- a first step of supplying a carbon-containing gas at one, first end of a tubular carbon nanotube synthesis furnace to grow a carbon nanotube from each of a plurality of catalyst particles suspended in the carbon nanotube synthesis furnace to synthesize a plurality of carbon nanotubes;
- a second step of orienting the plurality of carbon nanotubes in a longitudinal direction of the carbon nanotubes in a first channel provided in the carbon nanotube synthesis furnace, and thus assembling them together, to form a carbon nanotube assembled wire, and
- a third step of collecting the carbon nanotube assembled wire using a collecting gas stream flowing from a second end of the carbon nanotube synthesis furnace opposite to the first end in a direction away from the carbon nanotube synthesis furnace.

An apparatus for manufacturing a carbon nanotube assembled wire according to the present disclosure comprises:

- a tubular carbon nanotube synthesis furnace;
- a carbon-containing gas supply port provided at one, first end of the carbon nanotube synthesis furnace;
- a first channel provided in the carbon nanotube synthesis furnace; and
- a collecting gas stream generator provided at a second end of the carbon nanotube synthesis furnace opposite to the first end.

DETAILED DESCRIPTION

Figure 1:
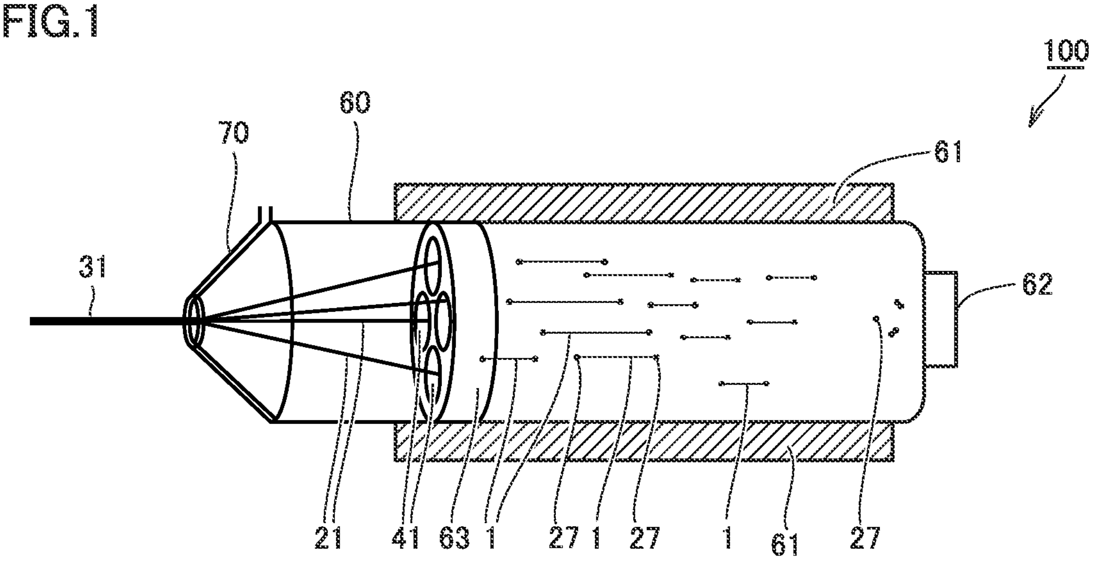
FIG. 1 is a diagram for illustrating a representative configuration example of a carbon nanotube assembled wire manufacturing apparatus according to a second embodiment.

Problem to be Solved by the Present Disclosure

A carbon nanotube assembled wire produced in a carbon nanotube synthesis furnace moves toward the downstream side of the carbon nanotube synthesis furnace along with a stream of a raw material gas. As a method for efficiently collecting a carbon nanotube assembled wire using a single carbon nanotube synthesis furnace, increasing the flow rate of the raw material gas to increase the flow velocity of the gas may be considered. Meanwhile, the upper limit for the flow rate of the raw material gas is determined while a catalytic reaction for synthesis of carbon nanotube is considered. Therefore, when a single carbon nanotube synthesis furnace is used, it is not possible to employ an approach to increase the flow rate of the raw material gas to be higher than an upper limit for the flow rate of the raw material gas that is determined with the catalytic reaction considered in order to improve efficiency of collecting carbon nanotubes.

Accordingly, the present disclosure contemplates a method for manufacturing a carbon nanotube assembled wire, that is capable of efficiently collecting a carbon nanotube assembled wire produced in a carbon nanotube synthesis furnace.

Furthermore, the present disclosure contemplates an apparatus for manufacturing a carbon nanotube assembled wire, that is capable of efficiently collecting a carbon nanotube assembled wire produced in a carbon nanotube synthesis furnace.

Advantageous Effect of the Present Disclosure

According to the present disclosure, a carbon nanotube assembled wire produced in a carbon nanotube synthesis furnace can be efficiently collected.

DESCRIPTION OF EMBODIMENTS OF THE PRESENT DISCLOSURE

First, embodiments of the present disclosure will be specified and described.

(1) The presently disclosed method for manufacturing a carbon nanotube assembled wire comprises:

a first step of supplying a carbon-containing gas at one, first end of a tubular carbon nanotube synthesis furnace to grow a carbon nanotube from each of a plurality of catalyst particles suspended in the carbon nanotube synthesis furnace to synthesize a plurality of carbon nanotubes;

a second step of orienting the plurality of carbon nanotubes in a longitudinal direction of the carbon nanotubes in a first channel provided in the carbon nanotube synthesis furnace, and thus assembling them together, to form a carbon nanotube assembled wire; and a third step of collecting the carbon nanotube assembled wire using a collecting gas stream flowing from a second end of the carbon nanotube synthesis furnace opposite to the first end in a direction away from the carbon nanotube synthesis furnace.

According to the present disclosure, a carbon nanotube assembled wire produced in a carbon nanotube synthesis furnace can be efficiently collected.

(2) Preferably, the collecting gas stream has a flow velocity equal to or larger than twice and equal to or smaller than 100 times a flow velocity of the carbon-containing gas. This allows the CNT assembled wire to be collected further efficiently.

(3) Preferably, in the third step, a plurality of carbon nanotube assembled wires are oriented in their longitudinal direction and thus assembled together.

This can provide a stranded wire (or bundle) composed of carbon nanotube assembled wires oriented in their longitudinal direction and thus assembled together.

(4) Preferably, the collecting gas stream is generated using an inert gas. This allows carbon nanotube assembled wires to be collected more efficiently while maintaining a quality of the CNT assembled wires.

(5) The presently disclosed apparatus for manufacturing a carbon nanotube assembled wire comprises:

a tubular carbon nanotube synthesis furnace;

a carbon-containing gas supply port provided at one, first end of the carbon nanotube synthesis furnace;

a first channel provided in the carbon nanotube synthesis furnace; and a collecting gas stream generator provided at a second end of the carbon nanotube synthesis furnace opposite to the first end.

According to the present disclosure, a carbon nanotube assembled wire produced in a carbon nanotube synthesis furnace can be efficiently collected.

(6) Preferably, the collecting gas stream generator includes:

a through hole configured to allow a carbon nanotube assembled wire to flow from a first hole located closer to the carbon nanotube synthesis furnace toward a second hole facing away from the carbon nanotube synthesis furnace; and a guiding gas discharge port provided outside the second hole.

This allows the carbon nanotube assembled wire to be discharged through the second hole to outside the collecting gas stream generator. The carbon nanotube assembled wire can be efficiently collected.

(7) Preferably, the through hole is in the form of a truncated cone. This causes the collecting gas stream passing through the through hole to converge from the first hole toward the second hole. This allows a plurality of carbon nanotube assembled wires flowing along with the collecting gas stream to approach one another and be assembled together to form a wire composed of CNT assembled wires stranded together.

(8) Preferably, the through hole is cylindrical. This allows a carbon nanotube assembled wire to be discharged through the second hole to outside the collecting gas stream generator. The carbon nanotube assembled wire can be efficiently collected.

Detailed Description of Embodiments of the Present Disclosure

A specific example of the presently disclosed method and apparatus for manufacturing a carbon nanotube assembled wire will now be described below with reference to the drawings. In the drawings of the present disclosure, the same reference numerals designate identical or corresponding parts. In addition, dimensional relations in length, width, thickness, depth, and the like are changed as appropriate for clarity and simplicity of the drawings, and do not necessarily represent actual dimensional relations.

In the present specification, an expression in the form of "A to B" means a range's upper and lower limits (that is, A or more and B or less), and when A is not accompanied by any unit and B is alone accompanied by a unit, A has the same unit as B.

First Embodiment: Method for Manufacturing Carbon Nanotube Assembled Wire

A method for manufacturing a carbon nanotube assembled wire according to one embodiment of the present disclosure (hereinafter also referred to as "the present embodiment") will now be described with reference to FIG. 1. FIG. 1 shows an example of an apparatus for manufacturing a carbon nanotube assembled wire that is used in the method for manufacturing a carbon nanotube assembled wire according to the present embodiment.

The method for manufacturing a carbon nanotube assembled wire according to the present embodiment comprises:

a first step of supplying a carbon-containing gas at one, first end of a tubular carbon nanotube synthesis furnace (hereinafter also referred to as a "CNT synthesis furnace") 60 to grow a carbon nanotube 1 from each of a plurality of catalyst particles 27 suspended in carbon nanotube synthesis furnace 60 to synthesize a plurality of carbon nanotubes 1;

a second step of orienting the plurality of carbon nanotubes 1 in a longitudinal direction of carbon nanotubes 1 in a first channel 41 provided in carbon nanotube synthesis furnace 60, and thus assembling them together, to form a carbon nanotube assembled wire 21; and a third step of collecting carbon nanotube assembled wire 21 using a collecting gas stream flowing from a second end of carbon nanotube synthesis furnace 60 opposite to the first end in a direction away from carbon nanotube synthesis furnace 60.

The method for manufacturing a carbon nanotube assembled wire according to the present embodiment can efficiently collect a carbon nanotube assembled wire produced in a carbon nanotube synthesis furnace.

<First Step>

A first step is a step of supplying a carbon-containing gas at one, first end of tubular carbon nanotube synthesis furnace 60 (in FIG. 1, a right end thereof provided with a carbon-containing gas supply port 62) to grow carbon nanotube 1 from each of a plurality of catalyst particles 27 suspended in carbon nanotube synthesis furnace 60 to synthesize a plurality of carbon nanotubes 1.

The first step is preferably performed under a condition in temperature of 800° C. or higher and 1200° C. or lower for example. Under the condition in temperature of 800° C. or higher and 1200° C. or lower, the carbon-containing gas is thermally decomposed and carbon crystal is grown on suspended catalyst particles to form carbon nanotubes. Separating a plurality of catalyst particles in close contact with one another in a flow of the carbon-containing gas allows CNTs to be also grown between the plurality of catalyst particles.

Temperature of 800° C. or higher allows carbon crystal to be grown at a higher rate and thus allows increased production efficiency. Temperature of 1200° C. or lower reduces content of impurity carbon and improves CNT in quality. The first step is performed under a condition in temperature more preferably of 900° C. or higher and 1150° C. or lower, and still more preferably 950° C. or higher and 1050° C. or lower.

In FIG. 1, catalyst particles 27 are suspended in a vicinity of carbon-containing gas supply port 62 of CNT synthesis furnace 60. Catalyst particles 27 are provided as follows: a catalyst (not shown) disposed in CNT synthesis furnace 60 near carbon-containing gas supply port 62 is heated and disintegrated by wind pressure of the carbon-containing gas to be particles.

Examples of the catalyst include ferrocene ($Fe(C_5H_5)_2$), nickelocene ($Ni(C_5H_5)_2$), cobaltocene ($Co(C_5H_5)_2$, etc.), and the like. Inter alia, ferrocene is particularly preferable as it is excellent in disintegrability and catalysis and allows elongate CNT to be obtained. It is believed that, when ferrocene is heated to a high temperature and exposed to the carbon-containing gas, it forms iron carbide ($Fe_3C$) on a surface thereof through carburization, and is thus disintegratable from the surface to release catalyst particles 27 successively. In this case, a major ingredient of catalyst particles 27 formed will be iron carbide or iron.

Examples of catalyst particles 27 other than the above include nickel, cobalt, molybdenum, gold, silver, copper, palladium, and platinum.

Catalyst particle 27 has an average diameter with a lower limit preferably of 30 nm or more, more preferably 40 nm or more, and still more preferably 50 nm or more. Catalyst particle 27 has the average diameter with an upper limit preferably of 1000 μm or less, more preferably 100 μm or less, and still more preferably 10 μm or less. Catalyst particle 27 having an average diameter of 30 nm or more allows a carbon nanotube formed by the catalyst particle to have an increased diameter and accordingly, be drawn at an increased rate and hence have a sufficient length. The catalyst particle having an average diameter of 1000 μm or less facilitates drawing a carbon nanotubes formed by the catalyst particle.

The carbon-containing gas is supplied through carbon-containing gas supply port 62 to CNT synthesis furnace 60. As the carbon-containing gas, a reducing gas such as hydrocarbon gas is used. Examples of such a carbon-containing gas include a gaseous mixture of methane and hydrogen, a gaseous mixture of ethylene and hydrogen, and a gaseous mixture of ethanol and hydrogen. The carbon-containing gas preferably includes carbon disulfide ($CS_2$) or thiophene as an assistive catalyst.

A lower limit for the flow velocity of the carbon-containing gas is preferably 0.05 cm/sec or more, more preferably 0.10 cm/sec or more, and still more preferably 0.20 cm/sec or more. An upper limit for the flow velocity of the carbon-containing gas is preferably 15.0 cm/sec or less. When the flow velocity of the carbon-containing gas is 0.05 cm/sec or more, catalyst particles 27 are sufficiently supplied with the carbon-containing gas, which facilitates growth of carbon nanotubes synthesized between catalyst particles 27. When the flow velocity of the carbon-containing gas is 15.0 cm/sec or less, it can prevent carbon nanotubes from detaching from catalyst particles 27 and thus stopping their growth. The flow velocity of the carbon-containing gas is preferably 0.05 cm/sec or more and 15.0 cm/sec or less, more preferably 0.10 cm/sec or more and 15.0 cm/sec or less, and still more preferably 0.20 cm/sec or more and 15.0 cm/sec or less. In the present specification, a "flow velocity of the carbon-containing gas" means an average flow velocity of the carbon-containing gas in a region within CNT synthesis furnace 60 between carbon-containing gas supply port 62 and first channel 41.

A lower limit for the Reynolds number of the flow in CNT synthesis furnace 60 of the carbon-containing gas supplied through carbon-containing gas supply port 62 is preferably 0.01 or more, and more preferably 0.05 or more. An upper limit for the Reynolds number is preferably 1000 or less, more preferably 100 or less, still more preferably 10 or less. A Reynolds number of 0.01 or more allows the apparatus to be designed with an increased degree of freedom. A Reynolds number of 1000 or less suppresses a disturbed flow of the carbon-containing gas and hence a disturbed synthesis of carbon nanotubes between catalyst particles 27.

Examples of carbon nanotube 1 obtained through the first step include a single-layer carbon nanotube in which only a single carbon layer (graphene) has a cylindrical shape, a double-layer carbon nanotube or a multilayer carbon nanotube in which a stack of a plurality of carbon layers has a cylindrical shape, and the like.

The shape of the carbon nanotube is not particularly limited, and both a carbon nanotube having closed ends and a carbon nanotube having open ends are included. Further, carbon nanotube 1 may have one or opposite ends with catalyst particle 27, which is used in synthesizing the carbon nanotube, adhering thereto. Further, carbon nanotube 1 may have one or opposite ends with a conical portion formed of conical graphene.

The carbon nanotube has a length preferably of 10 μm or more, more preferably 100 μm or more, for example. In particular, when the carbon nanotube has a length of 100 μm or more, such a length is suitable from the viewpoint of producing the CNT assembled wire. Although an upper limit value for the length of the carbon nanotube is not particularly limited, it is preferably 600 mm or less from the viewpoint of manufacturing. The length of the CNT is preferably 10 μm or more and 600 mm or less, and more preferably 100 μm or more and 600 mm or less. The length of the CNT can be measured through observation with a scanning electron microscope.

The carbon nanotube has a diameter preferably of 0.6 nm or more and 20 nm or less, and more preferably 1 nm or more and 10 nm or less. In particular, when the carbon nanotube has a diameter of 1 nm or more and 10 nm or less, such a diameter is suitable from the viewpoint of heat resistance under an oxidizing condition.

In the present specification, a diameter of a carbon nanotube means an average outer diameter of a single CNT. The CNT's average outer diameter is obtained by directly observing cross sections at any two portions of the CNT with a transmission electron microscope, measuring in each cross section a distance between mutually remotest two points on the outer circumference of the CNT, that is, an outer diameter, and calculating an average value of such obtained outer diameters. When the CNT has one or opposite ends with the conical portion, the diameter is measured at a portion other than the conical portion.

<Second Step>

The second step is a step of orienting a plurality of carbon nanotubes 1 that is obtained in the first step in the longitudinal direction of carbon nanotubes 1 in first channel 41 provided in carbon nanotube synthesis furnace 60 and thus assembling the carbon nanotubes to form carbon nanotube assembled wire 21.

A plurality of CNTs 1 synthesized in CNT synthesis furnace 60 enter first channel 41 with their longitudinal direction along the flow of the carbon-containing gas. First channel 41 is disposed to have its axial direction along the flow of the carbon-containing gas. In FIG. 1, a plurality of first channels 41 are formed to penetrate a first structure 63, and each first channel 41 is disposed to have its axial direction along the flow of the carbon-containing gas. An area in cross section of first channel 41 to which the flow of the carbon-containing gas is normal is smaller than that in cross section of CNT synthesis furnace 60 to which the flow of the carbon-containing gas is normal. Accordingly, the plurality of CNTs 1 having entered first channel 41 are oriented in the longitudinal direction of the CNTs in first channel 41 and thus assembled together to form CNT assembled wire 21.

The carbon nanotube assembled wire obtained in the second step is in the form of a yarn formed of a plurality of carbon nanotubes oriented in their longitudinal direction and thus assembled together.

The length of the carbon nanotube assembled wire is not particularly limited, and can be adjusted as appropriate depending on the application. A lower limit for the length of the CNT assembled wire is preferably 100 μm or more, more preferably 1000 μm or more, and further preferably 10 cm or more, for example. Although an upper limit for the length of the CNT assembled wire is not particularly limited, it can be 100 cm or less from the viewpoint of manufacturing. The length of the CNT assembled wire is preferably 100 μm or more and 100 cm or less, more preferably 1000 μm or more and 100 cm or less, and still more preferably 10 cm or more and 100 cm or less. The length of the CNT assembled wire is measured through observation with a scanning electron microscope, an optical microscope, or visual observation.

The diameter of the carbon nanotube assembled wire is not particularly limited, and can be adjusted as appropriate depending on the application. A lower limit for the diameter of the CNT assembled wire is, for example, preferably 1 μm or more, more preferably 10 μm or more, still more preferably 100 μm or more, and still more preferably 300 μm or more. Although an upper limit for the diameter of the CNT assembled wire is not particularly limited, it can be 1000 μm or less from the viewpoint of manufacturing. The diameter of the CNT assembled wire is preferably 1 μm or more and 1000 μm or less, more preferably 10 μm or more and 1000 μm or less, still more preferably 100 μm or more and 1000 μm or less, and still more preferably 300 μm or more and 1000 μm or less. In the present embodiment, the diameter of the CNT assembled wire is smaller than the length of the CNT assembled wire. That is, the direction of the length of the CNT assembled wire corresponds to the longitudinal direction.

In the present specification, the diameter of the carbon nanotube assembled wire means an average outer diameter of a single CNT assembled wire. The average outer diameter of a single CNT assembled wire is determined by observing cross sections of any two portions of the CNT assembled wire with a transmission electron microscope or a scanning electron microscope, measuring a distance between mutually remotest two points on the outer circumference of the CNT assembled wire in each cross section, that is, an outer diameter, and calculating an average value of such outer diameters.

It is confirmed through the following procedures (a1) to (a6) that the CNT assembled wire obtained in the present embodiment has a plurality of CNTs oriented in their longitudinal direction and thus assembled together.

(a1) Imaging CNT Assembled Wire

The CNT assembled wire is imaged using the following instrument under the following conditions.

Transmission electron microscope (TEM): "JEM2100" (product name) manufactured by JEOL Ltd.

Conditions: a magnification of 50,000 times to 1.2 million times, and an acceleration voltage of 60 kV to 200 kV (a2) Binarizing the Captured Image The image captured in the above step (a1) is binarized through the following procedure using the following image processing program.

Image processing program: Non-destructive paper surface fiber orientation analysis program "FiberOri8single03" (http://www.enomae.com/FiberOri/index.htm)

Processing Procedure

1. Histogram Average Brightness Correction
2. Background Removal
3. Binarization by Single Threshold
4. Brightness Inversion.

(a3) Fourier Transform of Binarized Image

The image obtained in step (a2) is subjected to Fourier transform using the same image processing program (Non-destructive paper surface fiber orientation analysis program "FiberOri8single03" (http://www.enomae.com/FiberOri/index.htm)).

(a4) Calculating Degree of Orientation and Intensity of Orientation

In the Fourier-transformed image, with the X-axis having a positive direction represented as 0°, an average amplitude with respect to counterclockwise angle (θ°) is calculated. A relationship between angle of orientation and intensity of orientation obtained from the Fourier-transformed image is graphically represented.

(a5) Measuring Half Width

Based on the above graphical representation, a full width at half maximum (FWHM) is measured.

(a6) Calculating Degree of Orientation

Based on the full width at half maximum, degree of orientation is calculated using the following equation (1).

$$\text{degree of orientation} = (180° - \text{full width at half maximum})/180° \quad (1)$$

A degree of orientation of 0 means being fully non-oriented. A degree of orientation of 1 means being fully oriented. In the present specification, when the degree of orientation is 0.8 or more and 1.0 or less, it is determined that a CNT assembled wire has a plurality of CNTs oriented in their longitudinal direction and thus assembled together.

When a carbon nanotube assembled wire is composed of carbon nanotubes with a degree of orientation of 0.8 or more and 1.0 or less, the CNT assembled wire is elongated while maintaining characteristics of electric conductivity and mechanical strength that the CNT has.

Note that, as measured by the applicants, it has been confirmed that, insofar as a given, single sample is measured, even when a result of measurement of degree of orientation is calculated a plurality of times while a location where a measurement field of view (having a size of 10 nm×10 nm) is selected is changed, such measurement results thus obtained do not have substantial variation.

<Third Step>

The third step is a step of collecting carbon nanotube assembled wire 21 that is obtained in the second step by using a collecting gas stream flowing from the second end of carbon nanotube synthesis furnace 60 opposite to the first end (i.e., a left end in FIG. 1) in a direction away from carbon nanotube synthesis furnace 60. This helps moving carbon nanotube assembled wire 21 to the downstream side of CNT synthesis furnace 60 and thus increases efficiency of collecting the CNT assembled wire. Further, the collecting gas stream can suppress deposition of CNTs and CNT assembled wire in the first channel and hence clogging of the first channel due to such deposition. This increases efficiency of collecting the CNT assembled wire.

While the collecting gas stream's flow velocity is not particularly limited, it is preferably higher than the flow velocity of the carbon-containing gas. This further increases efficiency of collecting the CNT assembled wire.

In the present specification, the "flow velocity of the collecting gas stream" means an average flow velocity of the collecting gas stream passing through a second hole 74 (see FIG. 2) of a collecting gas stream generator 70 provided on the side of the second end (or the downstream side) of CNT synthesis furnace 60.

While a lower limit for the flow velocity of the collecting gas stream is not particularly limited, it is preferably equal to or larger than twice, more preferably equal to or larger than 5 times, and still more preferably equal to or larger than 10 times the flow velocity of the carbon-containing gas from a viewpoint of collecting the CNT assembled wire more efficiently. While an upper limit for the flow velocity of the collecting gas stream is not particularly limited, it may for example be equal to or smaller than 100 times the flow velocity of the carbon-containing gas. The flow velocity of the collecting gas stream is preferably equal to or larger than twice and equal to or smaller than 100 times more preferably equal to or larger than 5 times and equal to or smaller than 100 times, and still more preferably equal to or larger than 10 times and equal to or smaller than 100 times the flow velocity of the carbon-containing gas.

The lower limit for the flow velocity of the collecting gas stream is preferably 2000 cm/sec or more, more preferably 3000 cm/sec or more, and still more preferably 4000 cm/sec or more. The upper limit for the flow velocity of the collecting gas stream is preferably 10000 cm/sec or less. The flow velocity of the collecting gas stream is preferably 2000 cm/sec or more and 10000 cm/sec or less, more preferably 3000 cm/sec or more and 10000 cm/sec or less, and still more preferably 4000 cm/sec or more and 10000 cm/sec or less.

In the third step, it is preferable that a plurality of carbon nanotube assembled wires are oriented in their longitudinal direction and thus assembled together. This can provide a stranded wire (or bundle) 31 composed of carbon nanotube assembled wires oriented in their longitudinal direction and thus assembled together.

As a method for orienting a plurality of carbon nanotube assembled wires in their longitudinal direction and thus assembling them together, converging the collecting gas stream toward the downstream side is considered. As the collecting gas stream converges, the plurality of CNT assembled wires approach one another and are thus assembled together to form wire 31 composed of CNT assembled wires stranded together.

Preferably, the collecting gas stream is generated using an inert gas. More specifically, it is preferable to generate on the downstream side of the CNT synthesis furnace a high speed gas stream of the inert gas flowing in a direction away from the CNT synthesis furnace. The high speed gas stream generates a suction force to draw air internal to the CNT synthesis furnace, and thus generates a collecting gas stream flowing from the second end of the CNT synthesis furnace in a direction away from the CNT synthesis furnace. As the collecting gas stream contains a large amount of a component of the inert gas, a reaction between the carbon nanotube assembled wire and the collecting gas stream is less easily caused, and the carbon nanotube assembled wire can be collected more efficiently while a quality of the CNT assembled wire is maintained.

Second Embodiment: Carbon Nanotube Assembled Wire Manufacturing Apparatus

One example of an apparatus for manufacturing a carbon nanotube assembled wire that is used in the method for manufacturing a carbon nanotube assembled wire according to the first embodiment will now be described with reference to FIGS. 1-7.

As shown in FIG. 1, a carbon nanotube assembled wire manufacturing apparatus 100 of the present embodiment comprises tubular carbon nanotube synthesis furnace 60, carbon-containing gas supply port 62 provided at one, first end (a right end in FIG. 1) of carbon nanotube synthesis furnace 60, first channel 41 provided in carbon nanotube synthesis furnace 60, and collecting gas stream generator 70 provided at the second end of carbon nanotube synthesis furnace 60 opposite to the first end.

<Carbon Nanotube Synthesis Furnace>

Carbon nanotube synthesis furnace (hereinafter also referred to as a "CNT synthesis furnace") 60 is in the form of a tube formed of quartz. In CNT synthesis furnace 60, carbon nanotubes 1 are formed on catalyst particles 27 using carbon-containing gas.

Carbon nanotube synthesis furnace 60 is heated with a beating device 61. When heated, CNT synthesis furnace 60 has an internal temperature preferably of 800° C. or higher to 1200° C. or lower. In order to maintain such a temperature, the carbon-containing gas may be heated and thus supplied through carbon-containing gas supply port 62 into CNT synthesis furnace 60, or the carbon-containing gas may be heated in CNT synthesis furnace 60.

The area in cross section of CNT synthesis furnace 60 is not particularly limited insofar as it is of a size allowing first channel 41 to be provided inside the CNT synthesis furnace.

A plurality of CNT assembled wires can be manufactured in a single CNT synthesis furnace by appropriately adjusting the area in cross section of CNT synthesis furnace 60 depending on the number of first channels 41 and the area in cross section of first channel 41.

A lower limit for the area in cross section of carbon nanotube synthesis furnace 60 is, for example, preferably 50 $mm^2$ or more, more preferably 500 $mm^2$ or more, and still more preferably 1500 $mm^2$ or more from the view point of more efficiently manufacturing the CNT assembled wire. While an upper limit for the area in cross section of the CNT synthesis furnace is not particularly limited, it can for example be 20000 $mm^2$ or less from the view point of manufacturing equipment. The area in cross section of the CNT synthesis furnace is preferably 50 $mm^2$ or more and 20000 $mm^2$ or less, more preferably 500 $mm^2$ or more and 20000 $mm^2$ or less, and still more preferably 1500 $mm^2$ or more and 20000 $mm^2$ or less. In the present specification, the area in cross section of CNT synthesis furnace 60 means an area of a hollow portion of the CNT synthesis furnace in a cross section to which the longitudinal direction (or center line) of the CNT synthesis furnace is normal.

<Carbon-Containing Gas Supply Port>

Carbon-containing gas supply port 62 is provided at one end of carbon nanotube synthesis furnace 60 (a right end thereof in FIG. 1), and the carbon-containing gas is supplied through carbon-containing gas supply port 62 into CNT synthesis furnace 60. A catalyst (not shown) is disposed in CNT synthesis furnace 60 near the carbon-containing gas supply port.

Carbon-containing gas supply port 62 can be configured to have a gas cylinder (not shown) and a flow control valve (not shown).

<First Channel>

First channel 41 is provided within carbon nanotube synthesis furnace 60. An area in cross section of the first channel is smaller than that in cross section of carbon nanotube synthesis furnace 60. In the first channel, a plurality of carbon nanotubes are oriented in their longitudinal direction and thus assembled together to form a carbon nanotube assembled wire. Furthermore, in the first channel, a tensile force can be applied to the carbon nanotubes in a direction toward the downstream side of the carbon-containing gas. When a tensile force acts on an end of a carbon nanotube, the carbon nanotube is pulled while extending from catalyst particle 27, and thus drawn in the longitudinal direction while it is plastically deformed and reduced in diameter. This facilitates elongating the CNT assembled wire.

The area in cross section of first channel 41 can be set, as appropriate, depending on the desired diameter of the CNT assembled wire. A lower limit for the area in cross section of first channel 41 is preferably 0.005 $mm^2$ or more, more preferably 0.01 $mm^2$ or more, and still more preferably 0.5 $mm^2$ or more from the view point of suppression of clogging by the CNT. An upper limit for the area in cross section of first channel 41 is preferably 100 $mm^2$ or less, more preferably 50 $mm^2$ or less, and still more preferably 10 $mm^2$ or less from the view point of facilitating formation of the CNT assembled wire. The area in cross section of first channel 41 is preferably 0.005 $mm^2$ or more and 100 $mm^2$ or less, more preferably 0.01 $mm^2$ or more and 50 $mm^2$ or less, and still more preferably 0.5 $mm^2$ or more and 10 $mm^2$ or less.

In the present specification, the area in cross section of first channel 41 means an area of the first channel in a cross section to which the center line of the first channel is normal.

First channel 41 has a length with a lower limit preferably of 1 mm or more, more preferably 10 mm or more, and still more preferably 15 mm or more from a viewpoint of easy application of tensile force to carbon nanotubes in a direction toward the downstream side of the carbon-containing gas and hence easy extension of CNTs. First channel 41 has the length with an upper limit preferably of 100 cm or less, more preferably 50 cm or less, and still more preferably 10 cm or less from a viewpoint of suppression of clogging of the first channel by CNTs. First channel 41 preferably has a length of 1 mm or more and 100 cm or less, more preferably 10 mm or more and 50 cm or less, and still more preferably 15 mm or more and 10 cm or less. In the present specification, the length of first channel 41 means a length thereof along the center line of first channel 41.

First channel 41 is preferably provided at a position apart from the first end of CNT synthesis furnace 60 by 20 cm or more and 1000 cm or less. According to this, CNTs flowing into the first channel have an appropriate length, and a CNT assembled wire is easily formed in the first channel.

Preferably, a plurality of first channels 41 extend in CNT synthesis furnace 60 in the longitudinal direction of CNT synthesis furnace 60 and are aligned in parallel. For example, as shown in FIG. 1, the plurality of first channels 41 may be provided in a single first structure 63. This allows single CNT synthesis furnace 60 to produce a plurality of CNT assembled wires 21.

In the present specification, the plurality of first channels 41 extending in the longitudinal direction of CNT synthesis furnace 60 and aligned in parallel means that the center line of each first channel 41 and the longitudinal direction of CNT synthesis furnace 60 form an angle of 0° or more and 5° or less.

While FIG. 1 shows four first channels 41 provided in parallel, the number of first channels is not limited to four and two or more first channels 41 can be provided. For the apparatus for manufacturing a CNT assembled wire according to the present embodiment, the number of first channels provided in parallel corresponds to the number of CNT assembled wires to be produced. Therefore, the number of CNT assembled wires 21 manufactured using a single CNT synthesis furnace can be increased by increasing the number of first channels provided in parallel.

<Collecting Gas Stream Generator (1)>

Collecting gas stream generator 70 is provided at the second end (or a left side in FIG. 1) of CNT synthesis furnace 60 opposite to the first end thereof. An example of the collecting gas stream generator will be described with reference to FIGS. 2 to 5.

Figure 2:
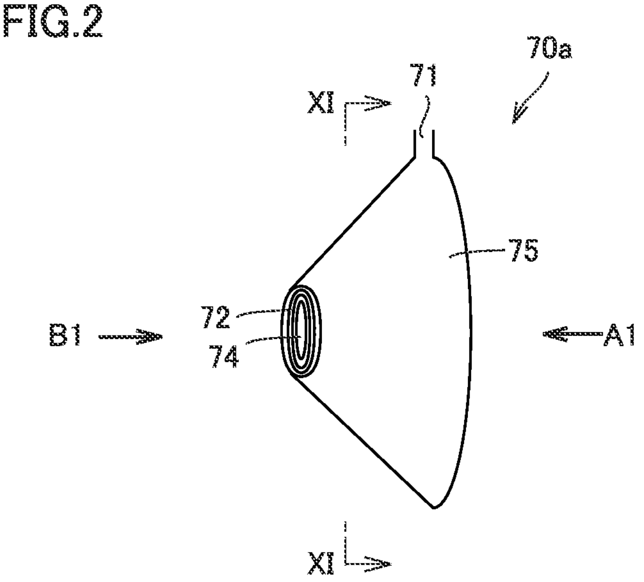
FIG. 2 is a perspective view showing an example of a collecting gas stream generator.
Figure 3:
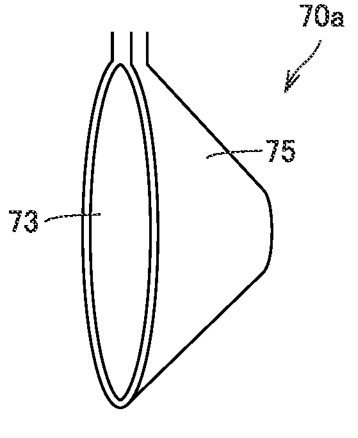
FIG. 3 is a perspective view of the FIG. 2 collecting gas stream generator, as viewed in the direction of an arrow A1 (or on a right side in FIG. 2).
Figure 4:
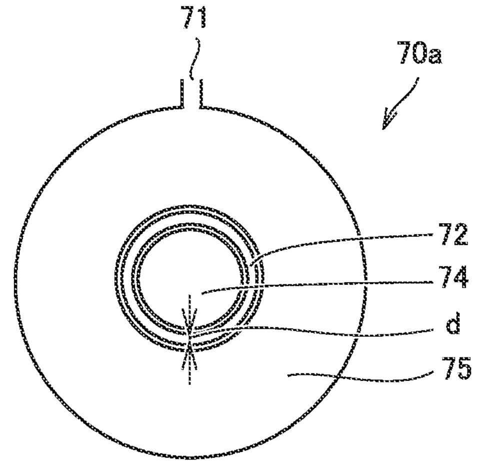
FIG. 4 is a view of the FIG. 2 collecting gas stream generator, as viewed in the direction of an arrow B1 (or on a left side in FIG. 2).
Figure 5:
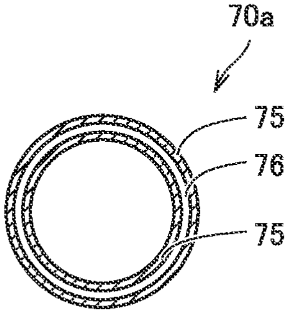
FIG. 5 is a cross section of the FIG. 2 collecting gas stream generator taken along a line XI-XI.

FIG. 2 is a perspective view of a collecting gas stream generator 70*a*. FIG. 3 is a perspective view of the FIG. 2 collecting gas stream generator 70*a*, as viewed in the direction of an arrow A1 (or on a right side in FIG. 2). FIG. 4 is a perspective view of the FIG. 2 collecting gas stream generator 70*a*, as viewed in the direction of an arrow B1 (or on a left side in FIG. 2). FIG. 5 is a cross section of the FIG. 2 collecting gas stream generator 70*a* taken along a line XI-XI. When the collecting gas stream generator shown in FIG. 2 is applied to the CNT assembled wire manufacturing apparatus of FIG. 1, the collecting gas stream generator is disposed such that a side thereof with a first hole 73 is connected to CNT synthesis furnace 60.

Collecting gas stream generator 70*a* includes a through hole configured to allow a carbon nanotube assembled wire to flow from first hole 73 toward second hole 74, and a guiding gas discharge port 72 provided outside second hole 74. Collecting gas stream generator 70*a* has the through hole in the form of a truncated cone with first hole 73 as a bottom plane and second hole 74 as a top plane.

When a guiding gas is discharged from guiding gas discharge port 72 in a direction away from carbon nanotube synthesis furnace 60, a suction force is generated by the guiding gas, and a collecting gas stream flowing from first hole 73 toward second hole 74 is generated. Carbon nanotube assembled wire 21 discharged from first channel 41 flows from first hole 73 of the through hole toward second hole 74 thereof along with the collecting gas stream, and is discharged outside of collecting gas stream generator 70*a* and thus collected.

Preferably, collecting gas stream generator 70*a* includes a second structure 75 having a shape surrounding the through hole, and second structure 75 is provided with a guiding gas introduction port 71, a guiding gas discharge port 72, and an internal channel 76 interconnecting guiding gas introduction port 71 and guiding gas discharge port 72. This allows the guiding gas to be discharged through guiding gas discharge port 72 at a controlled flow velocity by introducing the guiding gas into guiding gas introduction port 71 at a controlled flow velocity.

When the flow velocity of the guiding gas is increased, the flow velocity of the collecting gas stream is also increased. A lower limit for the flow velocity of the guiding gas is preferably 400 cm/sec or more, more preferably 600 cm/sec or more, and still more preferably 800 cm/sec or more. An upper limit for the flow velocity of the guiding gas is preferably 2000 cm/sec or less. The flow velocity of the guiding gas is preferably 400 cm/sec or more and 2000 cm/sec or less, more preferably 600 cm/sec or more and 2000 cm/sec or less, and still more preferably 800 cm/sec or more and 2000 cm/sec or less.

As shown in FIG. 4, preferably, guiding gas discharge port 72 is in the form of a ring having a width d with an upper limit of 1 mm or less. This allows guiding gas discharge port 72 to discharge the gas at an increased flow velocity even when the gas is introduced through guiding gas introduction port 71 in a small amount. An upper limit for width d is more preferably 0.5 mm or less, and still more preferably 0.25 mm or less A lower limit for width d may for example be 0.05 mm or more. Width d is preferably 0.05 mm or more and 1 mm or less, more preferably 0.05 mm or more and 0.5 mm or less, and still more preferably 0.05 mm or more and 0.25 mm or less.

The guiding gas is preferably made of an inert gas. This prevents an easy reaction between the carbon nanotube assembled wire and the collecting gas stream, and allows the carbon nanotube assembled wire to be collected more efficiently while a quality of the CNT assembled wire is maintained.

The FIG. 2 collecting gas stream generator 70*a* has the through hole in the form of a truncated cone with first hole 73 as a bottom plane and second hole 74 as a top plane. Accordingly, the collecting gas stream flowing through the through hole converges from first hole 73 toward second hole 74. Accordingly, a plurality of carbon nanotube assembled wires 21 flowing along the collecting gas stream approach one another and are thus assembled together to form wire 31 composed of CNT assembled wires stranded together.

When the collecting gas stream generator has the through hole in the form of a truncated cone, the first hole has a diameter preferably of 8 mm or more and 160 mm of less, the second hole has a diameter preferably of 4 mm or more and 80 mm or less, and the through hole has an axial length preferably of 5 mm or more and 100 mm or less <Collecting Gas Stream Generator (2)>

Figure 6:
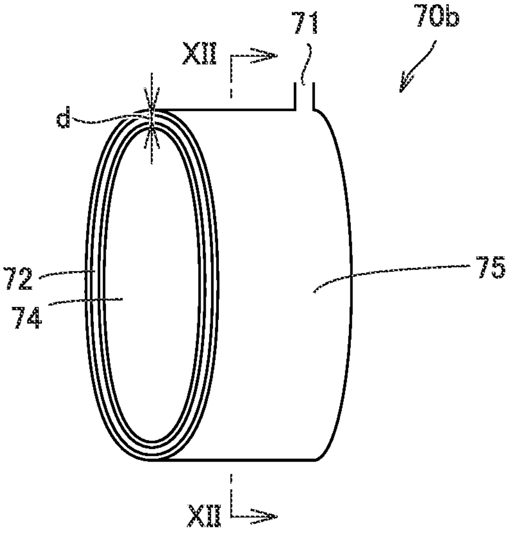
FIG. 6 is a perspective view showing another example of the collecting gas stream generator.
Figure 7:
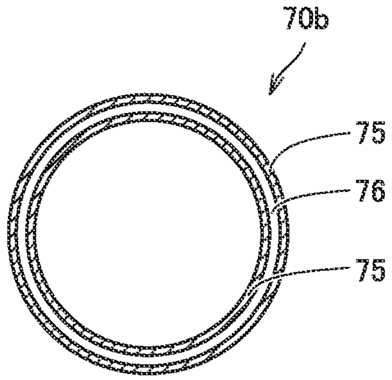
FIG. 7 is a cross section of the FIG. 6 collecting gas stream generator taken along a line XII-XII

Another example of the collecting gas stream generator will be described with reference to FIGS. 6 and 7. FIG. 6 is a perspective view of a collecting gas stream generator 70*b*. FIG. 7 is a cross section of the FIG. 6 collecting gas stream generator 70*b* taken along a line XII-XII. When it is applied to the CNT assembled wire manufacturing apparatus of FIG. 1, it is disposed to have a side thereof with the first hole (not shown) (i.e., a right side in FIG. 6) connected to CNT synthesis furnace 60. Collecting gas stream generator 70*b* basically has the same configuration as collecting gas stream generator 70*a* except that the through hole is cylindrical. Furthermore, a guiding gas introduced into collecting gas stream generator 70*b* can also be the same in flow velocity and type as that used for collecting gas stream generator 70*a*.

When the guiding gas is discharged from guiding gas discharge port 72 in a direction away from carbon nanotube synthesis furnace 60, a suction force is generated by the guiding gas, and a collecting gas stream flowing from the first hole toward second hole 74 is generated. Carbon nanotube assembled wire 21 discharged from first channel 41 flows from the first hole of the through hole toward second hole 74 thereof along with the collecting gas stream, and is discharged outside of collecting gas stream generator 70*b* and thus collected.

When the collecting gas stream generator has a cylindrical through hole, the first hole has a diameter preferably of 8 mm or more and 160 mm or less, the second hole has a diameter preferably of 8 mm or more and 160 mm or less, and the through hole has an axial length preferably of 5 mm or more and 100 mm or less.

EXAMPLES

The embodiments will now be described more specifically with reference to examples. Note, however, that the embodiments are not limited by these examples.

Example 1

As an apparatus 1 is prepared an apparatus for manufacturing a carbon nanotube assembled wire having the same configuration as the FIG. 1 apparatus for manufacturing a carbon nanotube assembled wire. It has a specific configuration as follows:

Apparatus 1 comprises: a carbon nanotube synthesis furnace (a quartz tube having a hollow portion with a diameter of 45 mm (with an area in cross section of 1590 mm$^2$), and a length 1000 mm), a carbon-containing gas supply port provided on one, first end side of the carbon nanotube synthesis furnace (i.e., on a right side in FIG. 1); four first channels (in the form of a cylinder having a diameter of 1 mm and a length of 50 mm) provided in the carbon nanotube synthesis furnace; and a collecting gas stream generator provided at a second end of the carbon nanotube synthesis furnace (i.e., on a left side in FIG. 1).

The four first channels extend in the longitudinal direction of the carbon nanotube synthesis furnace and are aligned in parallel A distance from the end of the CNT synthesis furnace closer to the carbon-containing gas supply port to the ends of the first channels closer to the carbon-containing gas supply port is set to 950 mm. A catalyst (ferrocene) and an assistive catalyst (thiophene) are disposed in the CNT synthesis furnace near the carbon-containing gas supply port.

The collecting gas stream generator has the configuration of the collecting gas stream generator shown in FIG. 2, and has a through hole in the form of a truncated cone. The first hole (or the bottom plane of the truncated cone) is a circle with a diameter of 35 mm. The second hole (or the top plane of the truncated cone) is a circle with a diameter of 30 mm. The through hole has an axial length (or the truncated cone has a height) of 50 mm. The guiding gas discharge port is in the form of a ring with width d of 0.3 mm. The collecting gas stream generator has a second structure provided with an internal channel interconnecting the guiding gas introduction port and the guiding gas discharge port.

Apparatus 1 is used to produce a carbon nanotube assembled wire and a wire composed of such carbon nanotube assembled wires stranded together for a sample 1. In apparatus 1, an electric furnace's internal temperature is raised to 1200° C. while an argon gas having an argon gas concentration of 100% by volume is supplied through the carbon-containing gas supply port into the CNT synthesis furnace at a flow rate of 1000 cc/min (flow velocity: 1.0 cm/sec) for 50 minutes. Subsequently, the argon gas is stopped and hydrogen gas and methane gas are supplied at flow rates of 10000 cc/min (flow velocity: 10.5 cm/sec) and 50 cc/min (flow velocity: 0.05 cm/sec), respectively, for 120 minutes. A gaseous mixture including the hydrogen gas and the methane gas (i.e., the carbon-containing gas) as a whole has a flow velocity of 11.55 cm/sec.

By supplying the hydrogen gas, the methane gas, and the carbon disulfide gas, the catalyst and the assistive catalyst are disintegrated and discharged into the CNT synthesis furnace. Subsequently, CNTs are grown in the CNT synthesis furnace and assembled together in the first channels to form CNT assembled wires.

By introducing an inert gas composed of nitrogen and argon through the guiding gas introduction port at a flow rate of 50000 cc/min (flow velocity: 1061 cm/sec), a high-speed guiding gas stream is discharged from the guiding gas discharge port, and a high-speed collecting gas stream (flow velocity: 5334 cm/sec) is generated.

A CNT assembled wire formed in a first channel flows from the first hole toward the second hole along with the collecting gas stream. As the through hole is in the form of a truncated cone, a plurality of carbon nanotube assembled wires approach one another inside the through hole and are thus assembled together to form a wire composed of CNT assembled wires stranded together. The wire composed of CNT assembled wires stranded together is collected. The wire composed of CNT assembled wires stranded together is collected more efficiently than when the collecting gas stream generator is not used.

When the collected wire composed of CNT assembled wires stranded together is observed with an electron microscope, it is observed that a plurality of carbon nanotube assembled wires are oriented in their longitudinal direction and thus assembled together. Further, it is observed that the carbon nanotube assembled wire has a plurality of carbon nanotubes oriented in their longitudinal direction and thus assembled together. The carbon nanotube is oriented at a degree of 0.9. How a degree of orientation is calculated is the same as the method described in the first embodiment, and accordingly, will not be described repeatedly.

While embodiments and examples of the present disclosure have been described as above, it is also planned from the beginning that the configurations of the above-described embodiments and examples are appropriately combined and variously modified.

The presently disclosed embodiments and examples are illustrative in any respects and should not be construed as being restrictive. The scope of the present invention is defined by the scope of the claims, rather than the embodiments and the examples described above, and is intended to include any modifications within the scope and meaning equivalent to the scope of the claims.

REFERENCE SIGNS LIST

1 carbon nanotube, 21 carbon nanotube assembled wire, 27 catalyst particle, 31 wire composed of carbon nanotube assembled wires stranded together, 41 first channel, 60 carbon nanotube synthesis furnace, 61 heating device, 62 carbon-containing gas supply port, 63 first structure, 70, **70*a*, 70*b* collecting gas stream generator, 71 guiding gas introduction port, 72 guiding gas discharge port, 73 first hole, 74 second hole, 75 second structure, 76 internal channel, 100** carbon nanotube assembled wire manufacturing apparatus.

The invention claimed is:

1. A method for manufacturing a carbon nanotube assembled wire, comprising:

a first step of supplying a carbon-containing gas at one, first end of a tubular carbon nanotube synthesis furnace to grow a carbon nanotube from each of a plurality of catalyst particles suspended in the carbon nanotube synthesis furnace to synthesize a plurality of carbon nanotubes;

a second step of orienting the plurality of carbon nanotubes in a longitudinal direction of the carbon nanotubes in a first channel provided in the carbon nanotube synthesis furnace, and thus assembling them together, to form a carbon nanotube assembled wire; and a third step of collecting the carbon nanotube assembled wire using a collecting gas stream flowing from a collecting gas stream generator provided at a second end of the carbon nanotube synthesis furnace opposite to the first end in a direction away from the carbon nanotube synthesis furnace, wherein the collecting gas stream generator includes:

a through hole configured to allow the carbon nanotube assembled wire to pass from the carbon nanotube synthesis furnace; and a structure having a shape surrounding the through hole, wherein the structure is provided with an internal channel separated from the through hole and configured to allow a guiding gas separated from the carbon-containing gas to flow from a guiding gas introduction port toward a guiding gas discharge port provided outside the through hole, and the guiding gas is introduced through the guiding gas introduction port, and the guiding gas introduced through the guiding gas introduction port is discharged around the through hole through the guiding gas discharge port.

2. The method for manufacturing a carbon nanotube assembled wire according to claim 1, wherein the collecting gas stream has a flow velocity equal to or larger than twice and equal to or smaller than 100 times a flow velocity of the carbon-containing gas.

3. The method for manufacturing a carbon nanotube assembled wire according to claim 1, wherein in the third step, a plurality of carbon nanotube assembled wires are oriented in their longitudinal direction and thus assembled together.

4. The method for manufacturing a carbon nanotube assembled wire according to claim 1, wherein the collecting gas stream is generated using an inert gas.

5. An apparatus for manufacturing a carbon nanotube assembled wire comprising:

a tubular carbon nanotube synthesis furnace;

a carbon-containing gas supply port provided at one, first end of the carbon nanotube synthesis furnace;

a first channel provided in the carbon nanotube synthesis furnace; and a collecting gas stream generator provided at a second end of the carbon nanotube synthesis furnace opposite to the first end, wherein the collecting gas stream generator includes:

a through hole configured to allow the carbon nanotube assembled wire to pass from the carbon nanotube synthesis furnace; and a structure having a shape surrounding the through hole, wherein the structure is provided with an internal channel separated from the through hole and configured to allow a guiding gas separated from the carbon-containing gas to flow from a guiding gas introduction port toward a guiding gas discharge port provided outside the through hole and surrounding the through hole.

6. The apparatus for manufacturing a carbon nanotube assembled wire according to claim 5, wherein the through hole is in a form of a truncated cone.

7. The apparatus for manufacturing a carbon nanotube assembled wire according to claim 5, wherein the through hole is cylindrical.

8. The method for manufacturing a carbon nanotube assembled wire according to claim 1, wherein the through hole is in a form of a truncated cone.

9. The method for manufacturing a carbon nanotube assembled wire according to claim 1, wherein the through hole is cylindrical.

* * * * *